United States Patent
Zhang et al.

(10) Patent No.: US 10,720,484 B2
(45) Date of Patent: Jul. 21, 2020

(54) PIXEL STRUCTURE, METHOD FOR FABRICATING THE SAME, AND DISPLAY DEVICE

(71) Applicant: BOE Technology Group Co., Ltd., Beijing (CN)

(72) Inventors: Yuxin Zhang, Beijing (CN); Hongfei Cheng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/190,975

(22) Filed: Nov. 14, 2018

(65) Prior Publication Data

US 2019/0181209 A1    Jun. 13, 2019

(30) Foreign Application Priority Data

Dec. 12, 2017  (CN) .......................... 2017 1 1318010

(51) Int. Cl.
*H01L 27/32* (2006.01)
*H01L 27/12* (2006.01)
*H01L 29/786* (2006.01)
*H01L 51/56* (2006.01)

(52) U.S. Cl.
CPC ........ *H01L 27/3265* (2013.01); *H01L 27/124* (2013.01); *H01L 27/1255* (2013.01); *H01L 27/3272* (2013.01); *H01L 29/78633* (2013.01); *H01L 27/1214* (2013.01); *H01L 27/3276* (2013.01); *H01L 2227/323* (2013.01)

(58) Field of Classification Search
None
See application file for complete search history.

(56) References Cited

U.S. PATENT DOCUMENTS

| | | | |
|---|---|---|---|
| 2010/0231124 A1* | 9/2010 | Song | H01L 27/3276 313/504 |
| 2015/0102336 A1* | 4/2015 | Kang | H01L 27/1225 257/43 |
| 2016/0133678 A1 | 5/2016 | Beak et al. | |
| 2016/0141349 A1 | 5/2016 | Yun et al. | |
| 2016/0190224 A1* | 6/2016 | Kim | H01L 27/124 257/40 |
| 2016/0372497 A1 | 12/2016 | Lee et al. | |

FOREIGN PATENT DOCUMENTS

| | | |
|---|---|---|
| CN | 105590949 A | 5/2016 |
| CN | 105609528 A | 5/2016 |
| CN | 106257677 A | 12/2016 |

OTHER PUBLICATIONS

Office Action for corresponding Chinese Application 201711318010.X dated Dec. 13, 2019.

* cited by examiner

*Primary Examiner* — Herve-Louis Y Assouman
(74) *Attorney, Agent, or Firm* — Arent Fox LLP; Michael Fainberg (57) ABSTRACT

Disclosed are a pixel structure, a method for fabricating the same, and a display device, and the pixel structure includes a pixel circuit including a light-emitting area and a non-light-emitting area, wherein the pixel circuit includes one or more storage capacitors, and at least one of the storage capacitors is arranged in the light-emitting area.

18 Claims, 5 Drawing Sheets

PIXEL STRUCTURE, METHOD FOR FABRICATING THE SAME, AND DISPLAY DEVICE

CROSS-REFERENCE TO RELATED APPLICATION

This application claims priority of Chinese Patent Application No. 201711318010.X, filed on Dec. 12, 2017, which is hereby incorporated by reference in its entirety.

FIELD

The present disclosure relates to the field of display technologies, and particularly to a pixel structure, a method for fabricating the same, and a display device.

BACKGROUND

As the display technologies are developing constantly, an Organic Light-Emitting Diode (OLED) display panel, a Quantum dot Light-Emitting Diode (QLED) display panel, and other new display panels have been widely favored due to their characteristics of being anti-impact, high vibration-resistance, a low weight, a small volume, more convenience to carry, etc.

SUMMARY

According to an aspect of the disclosure, an embodiment of the disclosure provides a pixel structure including a pixel circuit, the pixel circuit includes a light-emitting area and a non-light-emitting area, wherein the pixel circuit includes one or more storage capacitors, and electrodes of at least one of the storage capacitors are arranged in the light-emitting area.

Optionally, the pixel structure further includes a power line; and electrodes of the storage capacitor include a first electrode and a second electrode, and the first electrode and the second electrode are arranged at a same layer, and arranged integrally.

Optionally, the pixel circuit includes at least one thin film transistor arranged in the non-light-emitting area, and a light-shielding electrically-conductive layer corresponding to the thin film transistor, and the light-shielding layer is configured to shield light rays incident on the corresponding thin film transistor; and the second electrode is arranged at a same layer as the light-shielding layer, and processes for fabricating the second electrode and the light-shielding layer are same, and materials of the second electrode and the light-shielding layer are same.

Optionally, the pixel circuit includes at least one thin film transistor arranged in the non-light-emitting area, and the second electrode is arranged at a same layer as a gate of the thin film transistor, and processes for fabricating the second electrode and the thin film transistor are same, and materials of the second electrode and the thin film transistor are same.

Optionally, the thin film transistor includes a switch thin film transistor; the pixel structure includes a plurality of insulation layers, and a first lead; the second electrode is connected with one terminal of the first lead through a first through-hole arranged on the insulation layers; and a drain of the switch thin film transistor is connected with the other terminal of the first lead through a second through-hole arranged on the insulation layers; and the first lead is arranged at a same layer as an active layer of the thin film transistor, and processes for fabricating the first lead and the active layer are same, and materials of the first lead and the active layer are same.

Optionally, the pixel structure further includes a third electrode arranged opposite to the first electrode and the second electrode, and the first electrode, the second electrode, and the third electrode form the capacitor.

Optionally, an active layer of the thin film transistor is an ion-doped semiconductor material, and the third electrode is an electrically-conductive layer which is formed by a material same as that of the active layer in a same process as the active layer.

Optionally, the thin film transistor includes a switch thin film transistor; the pixel structure includes a plurality of insulation layers, and a second lead; the second electrode and the third electrode are connected with one terminal of the second lead respectively through a third through-hole and a fourth through-hole arranged on the insulation layers; and a drain of the switch thin film transistor is connected with the other terminal of the second lead through a fifth through-hole arranged on the insulation layers; and the second lead is arranged on the side of the first electrode away from the second electrode, and electrically insulated from the first electrode.

An embodiment of the disclosure further provides a display device including the pixel structure above.

An embodiment of the disclosure further provides a method for fabricating a pixel structure, the method including fabricating a pixel circuit, wherein at least one storage capacitor in the pixel circuit is fabricated in a light-emitting area.

Optionally, each storage capacitor of the pixel structure includes a first electrode and a second electrode arranged opposite to each other, and the pixel structure further includes a power line connected with the first electrode; and the fabricating method further includes forming the first electrode, and the power line in the pixel structure in a same process by: forming an electrically-conductive layer, and patterning the electrically-conductive layer, so that the electrically-conductive layer in a preset area of the power line is reserved as the power line, the electrically-conductive layer in the light-emitting area of the pixel structure is reserved as the first electrode, and the electrically-conductive layer between the first electrode and the power line is reserved so that the first electrode is connected with the power line.

Optionally, the pixel structure includes a thin film transistor arranged in a non-display area, and a light-shielding layer arranged below the thin film transistor; and the fabricating method further includes forming the light-shielding layer and the second electrode in a same process by: forming a light-shielding electrically-conductive layer, and patterning the electrically-conductive layer, so that the electrically-conductive layer in a preset area of the light-shielding layer is reserved as the light-shielding layer, and the electrically-conductive layer in the light-emitting area is reserved as the second electrode.

Optionally, the pixel structure includes a thin film transistor arranged in a non-display area; and the fabricating method further includes forming a gate of the thin film transistor, and the second electrode in a same process by: forming an electrically-conductive layer, and patterning the electrically-conductive layer, so that the electrically-conductive layer in a preset area of the gate is reserved as the gate, and the electrically-conductive layer in the light-emitting area is reserved as the second electrode.

Optionally, the pixel structure further includes a third electrode arranged opposite to the first electrode and the second electrode; and the fabricating method further includes forming an active layer of the thin film transistor and the third electrode in a same process by: forming a doped semiconductor layer, and patterning the semiconductor layer, so that the semiconductor layer in a preset area of the active layer is reserved as the active layer, and the semiconductor layer in the light-emitting area is reserved as the third electrode.

Optionally, the fabricating method further includes forming a first lead by: forming a doped semiconductor layer, and patterning the doped semiconductor layer, so that the semiconductor layer between the light-emitting area and the power line is reserved as the first lead, and the semiconductor layer in a preset area of the active layer is reserved as the active layer.

BRIEF DESCRIPTION OF THE DRAWINGS

In order to make the technical solutions in the embodiments of the disclosure or in the related art more apparent, the drawings to which reference will be made in the description of the embodiments or the related art will be introduced below briefly, and apparently the drawings to be described below illustrate only a part of the embodiments of the disclosure, and those ordinarily skilled in the art can further drive from these drawings other drawings without any inventive effort.

DETAILED DESCRIPTION OF THE EMBODIMENTS

The technical solutions according to the embodiments of the disclosure will be described below clearly and fully with reference to the drawings in the embodiments of the disclosure, and apparently the embodiments described below are only a part but not all of the embodiments of the disclosure. Based upon the embodiments here of the disclosure, all the other embodiments which can occur to those skilled in the art without any inventive effort shall fall into the scope of the disclosure. The shapes and sizes of respective components in the drawings are not intended to reflect any real proportion of a display device, but only intended to illustrate the disclosure of the disclosure.

In the description of different exemplary embodiments of the disclosure, the terms "on/above", "below", etc., are used in the specification to describe different exemplary features and elements in the embodiments of the disclosure, but these terms are used in this context only for the sake of a convenient description. Any disclosure in this specification shall not be construed as requiring a specific structure to be arranged in a specific direction as claimed in the embodiments of the disclosure.

Figure 1:
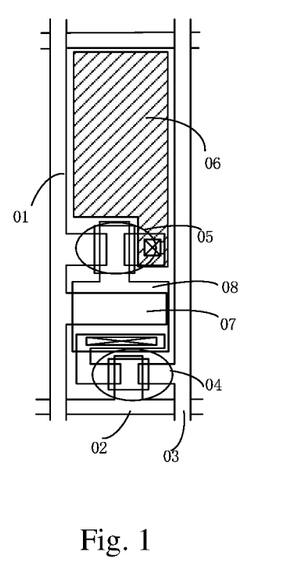
FIG. 1 illustrates the OLED or QLED pixel structure in the related art.
Figure 2:
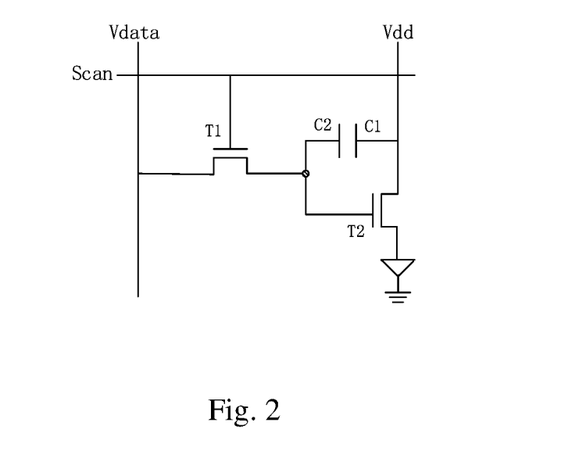
FIG. 2 is a schematic diagram of the circuit structure (2T1C) in FIG. 1.

When the existing QLED or OLED display is applied to a display with a large size, a capacitor Cs in a pixel circuit is typically arranged in a non-light-emission area of the pixel. As illustrated in FIG. 1 and FIG. 2, there is illustrated a 2T1C circuit structure (including two Thin Film Transistors (TFTs) and one capacitor (Cs)), for example. Two electrodes of the capacitor Cs are typically made respectively of a power line 01, and metal at the same layer as a gate of a driver thin film transistor 05. The capacitor Cs is typically arranged between the driver thin film transistor 05 and a switch thin film transistor 04. In order to guarantee an opening ratio of the pixel in the display element, the areas of the electrodes of the capacitor Cs is typically made as small as possible, but the performance of the display element may be affected as the capacitor Cs is made small.

Figure 3:
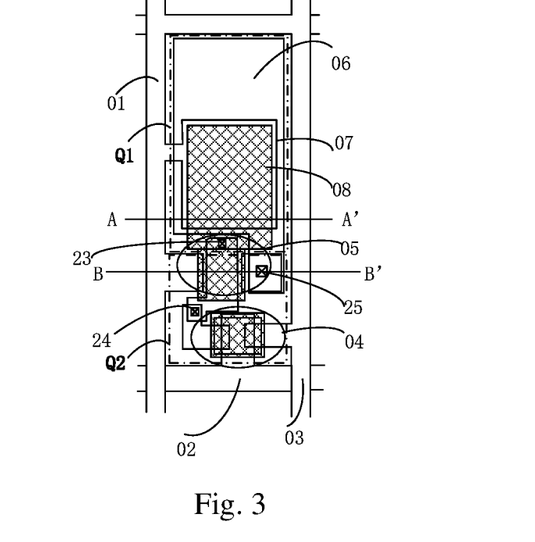
FIG. 3 is a schematic diagram of a pixel structure according to a first embodiment of the disclosure.

In an aspect of the embodiments of the disclosure, an embodiment of the disclosure provides a pixel structure as illustrated in FIG. 3, where the pixel structure includes a light-emitting area Q1 (a Q1 area defined in a dotted box as illustrated in FIG. 3) and a non-light-emitting area Q2 (a Q2 area defined in a dotted box as illustrated in FIG. 3). The pixel structure further includes a pixel circuit including one or more storage capacitors Cs, and electrodes of at least one of the storage capacitors Cs are arranged in the light-emitting area Q1.

The light-emitting area Q1 in the embodiment of the disclosure refers to an area through which light can be transmitted in each pixel structure; and the non-light-emitting area Q2 refers to another area than the light-emitting area Q1 in each pixel structure.

Here, the pixel structure according to the embodiment above can be applicable to the field of organic light-emitting or quantum dot light-emitting display panels. Correspondingly the pixel structure can be an OLED pixel structure or a QLED pixel structure.

The electrodes of the storage capacitor are two electrodes arranged opposite to each other, and the two electrodes can be transparent or non-transparent electrodes. For example, when one or both of the electrodes is or are arranged on the light exit side of the light-emitting element, the electrode(s) is a transparent electrode(s) to thereby guarantee the ratio of light exiting the pixel. The electrode which is not arranged on the light exit side of the light-emitting element can be an electrode of any material.

In the embodiment above of the disclosure, the at least one storage capacitor Cs is arranged in the light-emitting area of the pixel so that the size of the non-light-emitting area in the pixel can be reduced in effect while the size of the light-emitting area is increased, to thereby improve an opening ratio of the pixel. Furthermore, the storage capacitor Cs is arranged in the light-emitting area Q1 with a larger size, the preset size thereof can be adjusted as appropriate (e.g., increased) as needed for a different product without being restricted too much by the factor of the opening ratio of the pixel, so as to better satisfy a demand for displaying an image.

In order not to increase the thickness of the pixel structure, and to lower the complexity of wiring in the pixel structure, one of the electrodes of the storage capacitor in the pixel structure is arranged at the same layer as and even connected with some signal line or a power line in the pixel structure.

For example, the pixel structure further includes a power line; and the electrodes of the storage capacitor include a first electrode and a second electrode, and the first electrode is arranged at the same layer as and arranged integral to the power line. It shall be noted here that in the integral arrangement as referred to in the embodiment of the disclosure, both the first electrode and the power line are made of the same metal layer in the same patterning process, and at least a part of a metal layer between the first electrode and the power line is reserved, that is, the first electrode is not disconnected from the power line.

Figure 6:
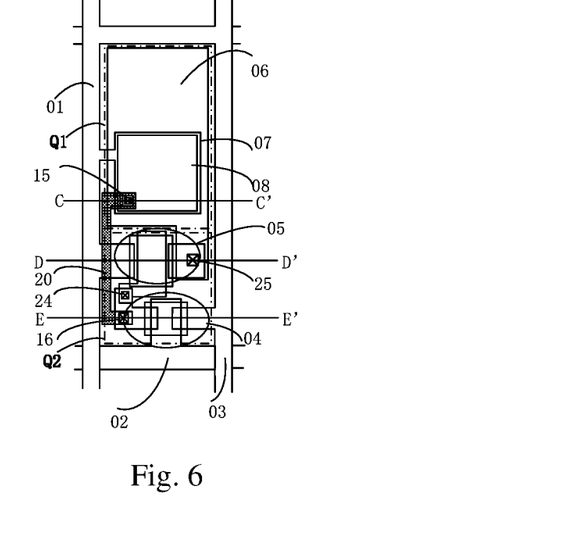
FIG. 6 is a schematic diagram of a pixel structure according to a second embodiment of the disclosure.

As illustrated in FIG. 3 or FIG. 6 illustrating a 2T1C pixel structure, the pixel structure according to the embodiment of the disclosure is defined by a power line (Vdd line) 01, gate lines 02, and a data line 03. The electrodes of the storage capacitor Cs include a first electrode 07 and a second electrode 08. The first electrode 07 and the second electrode 08 are arranged opposite to each other, and their orthographic projections onto the substrate 09 at least partially overlap. The first electrode 07 and the power line (Vdd line) 01 are fabricated in the same patterning process, arranged at the same layer, and arranged integrally.

In the pixel structure above according to the embodiment of the disclosure, the first electrode 07 and the power line are fabricated in the same patterning process, so no additional fabrication process will be performed to thereby dispense with process steps in effect, and lower a cost.

Generally, a pixel circuit of the pixel structure, e.g., a pixel driver circuit, includes a plurality of transistors, e.g., a switch transistor, a driver transistor for driving a light-emitting element, etc., in addition to the storage capacitor. The electrode of the storage capacitor, which is not arranged on the light exit side of the light-emitting element can be formed in the same process as a layer in a thin film transistor, or can be formed in the same process as an electrically-conductive light-shielding layer below the thin film transistor, to thereby simplify a process flow without additionally increasing the thickness of the pixel structure.

Figure 4:
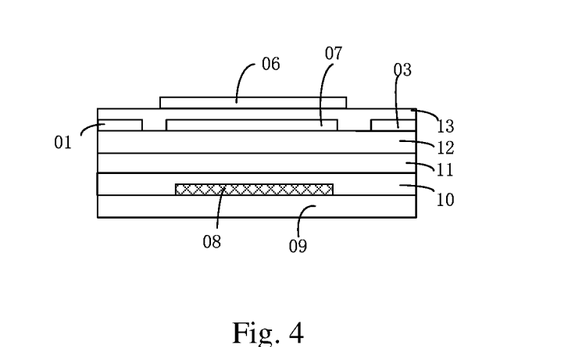
FIG. 4 is a sectional view along A-A' in FIG. 3.
Figure 5:
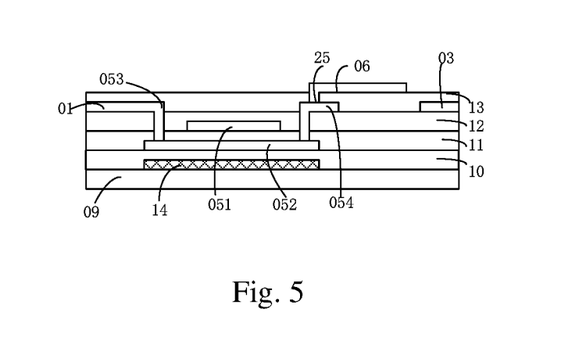
FIG. 5 is a sectional view along B-B' in FIG. 3.

In some implementation, as illustrated in FIG. 4 and FIG. 5, the pixel circuit includes at least one thin film transistor arranged in the non-light-emitting area Q2, and the at least one thin film transistor can be a switch thin film transistor 04 or a driver thin film transistor 05. In order to alleviate a transistor from being affected by incident light, generally an electrically-conductive light-shielding layer 14 is arranged on the bottom of the thin film transistor, and the light-shielding layer 14 is configured to shield light rays incident on the corresponding thin film transistor. The second electrode 08 and the light-shielding layer 14 in the embodiment of the disclosure are made of the same material in the same patterning process, and arranged at the same layer. The material of the light-shielding layer 14 is an electrically-conductive material, which can particularly be a metal material. For example, a metal layer is deposited on the substrate, and mask, exposure, development, photolithograph, and other processes are performed thereon, so that the metal layer corresponding to a TFT area is reserved, and the metal layer at a preset position in the light-emitting area is reserved as the second electrode of the storage capacitor.

In the embodiment above, the second electrode 08 is fabricated in the same patterning process as the light-shielding layer 14 instead of being fabricated separately, to thereby dispense with process steps in effect, and lower a cost.

As illustrated in FIG. 5 which is a schematic diagram of the pixel structure in a sectional view, a light-shielding layer 14, a first insulation layer 10, an active layer 052, a second insulation layer 11, a gate 051, a third insulation layer 12, a source and a drain (a source 053 and a drain 052), a data line 03 arranged at the same layer as the source and the drain, and a fourth insulation layer 13, of the driver transistor 05 are arranged above the substrate 09 successively, and an anode 06 of a light-emitting element is further arranged thereon. The anode 06 of the light-emitting element is connected with the drain 054 of the driver transistor through an eighth through-hole 25.

The second electrode 08 is connected with the gate 051 of the driver thin film transistor 05 through a sixth through-hole 23; and the gate 051 of the driver thin film transistor 05 is connected with a drain 044 of the switch thin film transistor 04 through a seventh through-hole 24.

It shall be noted that a hole injection layer, a hole transmission layer, a light-emitting layer, an electron transmission layer, and an electron injection layer are further arranged as needed between the anode 06 and the cathode (not illustrated).

Figure 7:
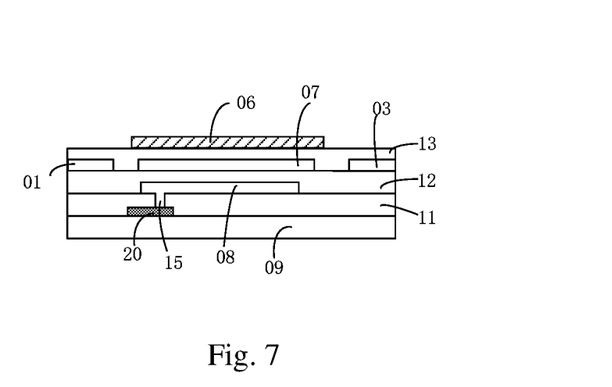
FIG. 7 is a sectional view along C-C' in FIG. 6.

In some other implementation of the disclosure, as illustrated in FIG. 6 and FIG. 7, the pixel circuit includes at least one thin film transistor arranged in the non-light-emitting area Q2, and the second electrode 8, and a gate of the thin film transistor are made of the same material in the same patterning process, and arranged at the same layer. The thin film transistor can be the switch thin film transistor 04 or the driver thin film transistor 05.

In the embodiment above, the second electrode 08 is fabricated in the same patterning process as the gate of the thin film transistor instead of being fabricated separately, to thereby dispense with process steps in effect, and lower a cost.

A capacitor Cs is arranged in the light-emitting area Q1. The capacitor Cs includes a first electrode 07 and a second electrode 08 arranged opposite to each other. Orthographic projections of the first electrode 07 and the second electrode 08 onto the substrate 09 at least partially overlap, thus forming the capacitor Cs. The first electrode 07 and the Vdd line 01 are fabricated in the same patterning process at the same layer, and arranged integrally. The second electrode 08, and the gate 041 of the switch thin film transistor 04, or the gate 051 of the driver thin film transistor 05 are made of the same material in the same patterning process, and arranged at the same layer.

Figure 8:
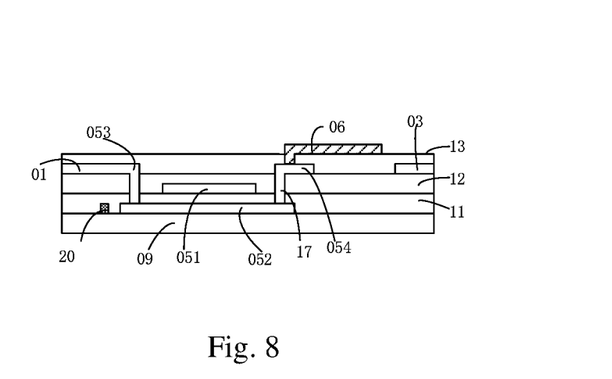
FIG. 8 is a sectional view along D-D' in FIG. 6.
Figure 9:
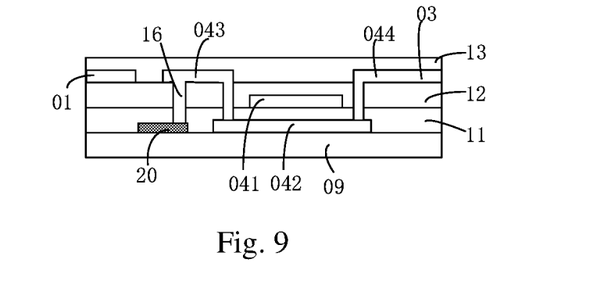
FIG. 9 is a sectional view along E-E' in FIG. 6.

Optionally, as illustrated in FIG. 7 and FIG. 8, the pixel structure includes a plurality of insulation layers, and a first lead 20. The second electrode 08 is connected with one terminal of the first lead 20 through a first through-hole 15 arranged on the insulation layers, and the drain 044 of the switch thin film transistor 04 is connected with the other terminal of the first lead 20 through a second through-hole 16 arranged on the insulation layers. The first lead 20, and an active layer 042 of the switch thin film transistor 04, or an active layer 052 of the driver thin film transistor 05 are made of the same material in the same patterning process, and arranged at the same layer. The material of the active layer 042 or 052 is an ion-doped semiconductor material, e.g., an ion-doped low-temperature poly-Si material. The ion-doped low-temperature poly-Si material has a good electrical conductivity.

The first lead 20 is fabricated in the same patterning process as the active layer 042 of the switch thin film transistor 04 instead of being fabricated separately, to thereby dispense with process steps, and lower a cost.

The first lead 20 can be arranged between the light-emitting area Q1 and the power line 01 or at another position as long as the second electrode 08 is connected with the drain 054 of the driver thin film transistor 05. The data line 03 is arranged at the same layer as and fabricated in the same patterning process as the source 053 and the drain 054 of the driver thin film transistor 05. The gate 051 of the driver thin film transistor 05 is connected with the drain 044 of the switch thin film transistor 04 through the seventh through-hole 24; and the anode is connected with the drain 054 of the driver thin film transistor 05 through the eighth through-hole 25.

Figure 10:
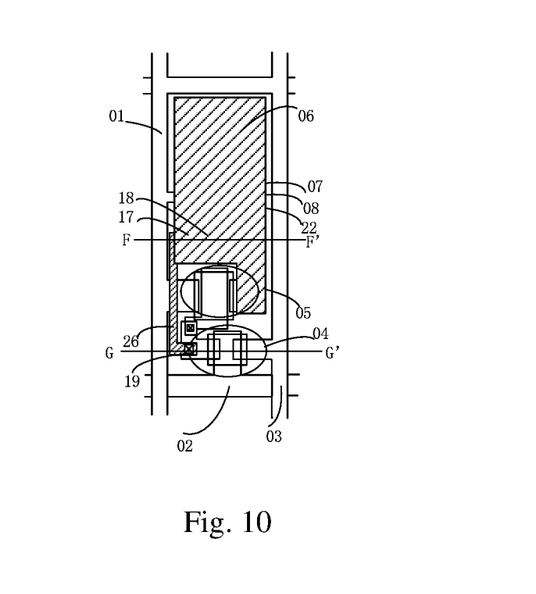
FIG. 10 is a schematic diagram of a pixel structure according to a third embodiment of the disclosure.

In some implementation, as illustrated in FIG. 10 and FIG. 14, the pixel circuit according to the embodiment of the disclosure further comprises a third electrode 22 arranged opposite to the first electrode 07 and the second electrode 08. The orthographic projections of the first electrode 07, the second electrode 08, and the third electrode 22 onto the substrate 09 at least partially overlap, thus forming the storage capacitor Cs. In this embodiment, every two electrodes can form a storage capacitor, thus further enlarging the storage capacitor in the pixel circuit.

Optionally, the third electrode 22, and the active layer of the thin film transistor in the embodiment above are made of the same material, in a same patterning process and arranged at the same layer. The active layer of the thin film transistor is an ion-doped semiconductor material, e.g., an ion-doped low-temperature poly-Si material. The ion-doped low-temperature poly-Si material has a good electrical conductivity, and an electrode can be made of this material. The third electrode 22 is fabricated in the same patterning process as the active layer of the thin film transistor instead of being fabricated separately, to thereby dispense with process steps, and lower a cost.

Figure 11A:
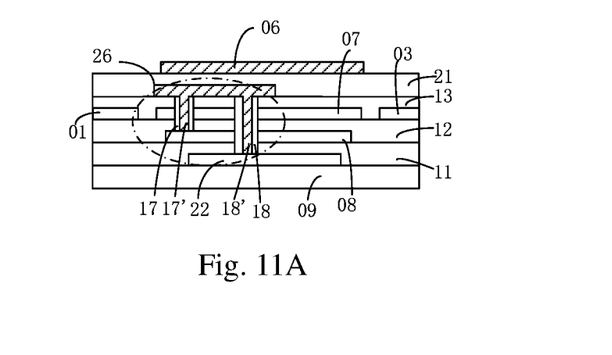
FIG. 11A is a sectional view along F-F' in FIG. 10.
Figure 11B:
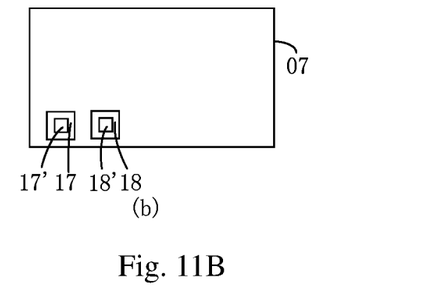
FIG. 11B is a top view of a part circled in a dotted line in FIG. 11A.
Figure 12:
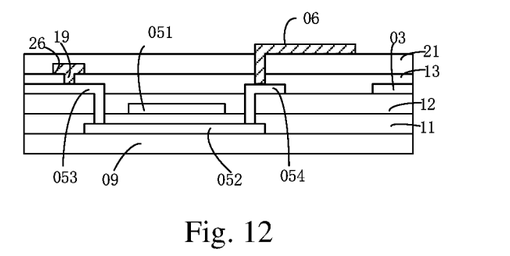
FIG. 12 is a sectional view along G-G' in FIG. 10.
Figure 13:
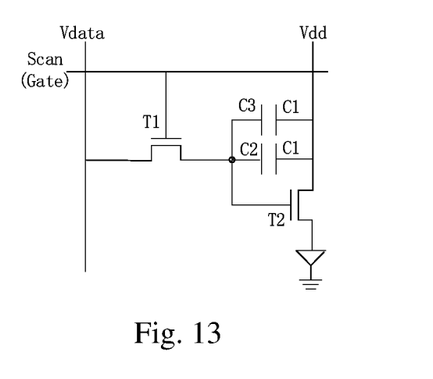
FIG. 13 is a schematic diagram of the circuit structure (2T2C) in FIG. 10.

Optionally, as illustrated in FIG. 11 and FIG. 12, the thin film transistors include the switch thin film transistor 04 and the driver thin film transistor 05. The pixel structure includes a plurality of insulation layers, and a second lead 26. The second electrode 08 and the third electrode 22 are connected with one terminal of the second lead 26 respectively through a third through-hole 17 and a fourth through-hole 18 arranged on the insulation layers. The drain 044 of the switch thin film transistor 04 is connected with the other terminal of the second lead 26 through a fifth through-hole 19 arranged on the insulation layer. The second lead 26 is arranged on the side of the first electrode 07 away from the second electrode 08, and electrically insulated from the first electrode 07.

The second lead 26 is arranged above the fourth insulation layer 13, and the fifth insulation layer 21 and the anode 06 are arranged above the second lead 26 successively. The second lead 26 is made of an electrically-conductive material, which can particularly a metal material. As illustrated in FIG. 11A, the third through-hole 17 shall run through the first electrode 07. The third through-hole 17 is filled with an insulation material, a first small through-hole 17' is fabricated in the insulation material, and the second lead 26 is connected with the second electrode 08 through the first small through-hole 17'; and the fourth through-hole 18 is also filled with the insulation material, a second small through-hole 18' is fabricated in the insulation material, and the second lead 26 is connected with the third electrode 22 through the second small through-hole 18'. Alternatively the second lead 26 can be connected with the third electrode 22 through the first small through-hole 17', and connected with the second electrode 08 through the second small through-hole 18'.

The data line 03 is fabricated at the same layer as and in the same patterning process as the source 053 and the drain 054 of the driver thin film transistor 05. The gate 051 of the driver thin film transistor 05 is connected with the drain 044 of the switch thin film transistor 04 through the seventh through-hole 24; and the anode 06 is connected with the drain 054 of the driver thin film transistor 05 through the eighth through-hole 25.

The pixel structure according to the embodiments of the disclosure can be further applicable to an array substrate, or a display panel, a display, or a display device including the array substrate. For example, the pixel structure can be applicable to an Organic Light-Emitting Diode (OLED) display panel, a Quantum dot Light-Emitting Diode (QLED) display panel, or another display device, although the embodiment of this disclosure will not be limited thereto.

It shall be noted that the 2T1C and 2T2C pixel structures according to the embodiments of the disclosure have been described only by way of an example, but the pixel structure according to the embodiment of the disclosure can also be applicable to a pixel structure including a plurality of thin film transistors, and a plurality of capacitors. When the pixel circuit operates with a plurality of capacitors, a part or all of the plurality of capacitors can be arranged in the light-emitting area.

An embodiment of the disclosure further provides a display device, which can be a display panel, a display, a mobile terminal, an on-vehicle display product, a medical device display product, etc.

An embodiment of the disclosure provides a method for fabricating a pixel structure, the method includes fabricating a pixel circuit, where at least one storage capacitor in the pixel circuit is fabricated in a light-emitting area.

Optionally, each storage capacitor of the pixel structure includes a first electrode 07 and a second electrode 08 arranged opposite to each other, and the pixel structure further includes a power line 01 connected with the first electrode 07.

The fabricating method further includes forming the first electrode 07, and the power line 01 in the pixel structure in the same process, to be specific, forming an electrically-conductive layer, and patterning the electrically-conductive layer, so that the electrically-conductive layer in a preset area of the power line 01 is reserved as the power line, the electrically-conductive layer in the light-emitting area Q1 of the pixel structure is reserved as the first electrode 07, and also the electrically-conductive layer between the first electrode 07 and the power line 01 is reserved so that the first electrode 07 is connected with the power line 01.

It shall be noted here that the preset area as referred to in the embodiment of the disclosure is a preset area in which some functional layer is to be fabricated, e.g., a preset area in which a power line, a light-shielding layer, a gate, or another functional layer is to be fabricated. The preset area in which some functional layer is to be fabricated is an area, in which the functional layer is to be formed, designed in advance before the functional layer is fabricated, and for example, a preset area of a power line is an area in which the power line is to be formed, where the area is designed in advance.

Optionally, the first electrode 07 is fabricated in the following steps:

a source 053 of a driver thin film transistor 05 is fabricated by firstly forming the electrically-conductive layer, and patterning the electrically-conductive layer; and also forming the first electrode 07 in the light-emitting area of the pixel structure, forming the power line 01 on one side of the light-emitting area Q1, and also forming the source 053 and a drain 04 of the driver thin film transistor 05. The power line is arranged integral to the first electrode 07.

Optionally, the pixel structure includes a thin film transistor arranged in a non-light-emitting area Q2, and a light-shielding layer 14 arranged below the thin film transistor.

The fabricating method further includes forming the light-shielding layer 14 and the second electrode 08 in the same process, to be specific, forming a light-shielding electrically-conductive layer, and patterning the electrically-conductive layer, so that the electrically-conductive layer in a preset area corresponding to the thin film transistor is reserved as the light-shielding layer 14, and also the electrically-conductive layer in the light-emitting area Q1 is reserved as the second electrode 08.

Optionally, the second electrode 08 is fabricated in the following steps:

firstly the light-shielding electrically-conductive layer is formed above the substrate 09, and patterned, and also the second electrode 08, the switch thin film transistor 04, and the light-shielding layer 14 of the drive switch thin film transistor 05 are formed in the light-emitting area Q1 of the pixel structure.

Optionally, the pixel structure includes a thin film transistor arranged in a non-light-emitting area Q2, and a second electrode 08 arranged at the same layer as a gate of the thin film transistor.

The fabricating method further includes forming the second electrode 08 in one process, to be specific, forming an electrically-conductive metal layer at the gate layer of the thin film transistor, and patterning the electrically-conductive metal layer, so that the electrically-conductive metal layer in a preset area is reserved as the gate, and also the electrically-conductive metal layer in the light-emitting area Q1 is reserved as the second electrode 08.

Optionally, the pixel structure further includes a third electrode 22 arranged opposite to the first electrode 07 and the second electrode 08.

The fabricating method further includes forming an active layer of the thin film transistor and the third electrode 022 in the same process, to be specific, forming a doped semiconductor layer, and patterning the semiconductor layer, so that the semiconductor layer in a preset area of the active layer is reserved as the active layer, and the semiconductor layer in the light-emitting area is reserved as the third electrode 22.

Optionally, the third electrode 22 is fabricated in the following steps:

a doped low-temperature poly-Si layer is formed above the substrate 09, and patterned; and also the active layer 052 of the driver thin film transistor, and the third electrode 022 are formed.

Optionally, the method for fabricating a pixel structure according to the embodiment of the disclosure further includes forming a first lead, to be specific, forming a doped semiconductor layer, and patterning the doped semiconductor layer, so that the semiconductor layer between the light-emitting area and the power line is reserved as the first lead, and the semiconductor layer in a preset area of the active layer is reserved as the active layer.

Optionally, the method for fabricating a pixel structure according to the embodiment of the disclosure further includes forming a second lead, to be specific, forming an electrically-conductive metal layer, and patterning the electrically-conductive metal layer, so that the electrically-conductive metal layer between the light-emitting area and the power line is reserved as the second lead.

Furthermore, the method according to the embodiment of the disclosure further includes the step of forming a first through-hole 15 and a second through-hole 16 above insulation layers of the pixel structure so that the first lead 20 is connected with the second electrode 08 through the first through-hole 15, and connected with the drain 044 of the switch thin film transistor through the second through-hole 16.

Furthermore, the method according to the embodiment of the disclosure further includes the step of fabricating a third through-hole 17, a fourth through-hole 18, and a fifth through-hole 19 above insulation layers of the pixel structure, and the step of arranging a third small through-hole 17' and a fourth small through-hole 18' in the third through-hole 17 and the fourth through-hole 18.

The third small through-hole 17' and the fourth small through-hole 18' are fabricated in the steps of: opening the third through-hole 17 on a fourth insulation layer 13, the first electrode 07, and a third insulation layer 12; opening the fourth through-hole 18 on the fourth insulation layer 13, the first electrode 07, the third insulation layer 12, the second electrode 08, and a second insulation layer 11; and filling the third through-hole 17 and the fourth through-hole 18 with an insulation material, and opening the third small through-hole 17' and the fourth small through-hole 18' in the filled insulation material. The second lead 16 is connected respectively with the second electrode 08 and the third electrode 22 through the third small through-hole 17' and the fourth small through-hole 18', and also connected with the drain 054 of the driver thin film transistor through the fifth through-hole 19. Alternatively in this embodiment, the second lead 26 can be connected respectively with the third electrode 22 and the second electrode 08 through the third small through-hole 17' and the fourth small through-hole 18', and also connected with the drain 054 of the driver thin film transistor through the fifth through-hole 19.

In summary, in the embodiments of the disclosure, the capacitor Cs is arranged in the light-emitting area Q1 of the pixel so that the size of the non-light-emitting area Q2 of the pixel can be reduced in effect to thereby improve an opening ratio of the pixel; and also since the capacitor Cs is arranged in the light-emitting area of the pixel, the areas of the electrodes of the capacitor Cs can be further increased to thereby enlarge the capacitor so as to better satisfy a demand for displaying an image.

The foregoing disclosure is only illustrative of the particular embodiments of the disclosure, but the claimed scope of the disclosure will not be limited thereto, and any variations or alternatives which can readily occur to those skilled in the art without departing from the spirit of the disclosure shall fall into the scope of the disclosure. Accordingly the claimed scope of the disclosure shall be as defined in the accompanying claims.

The invention claimed is:

1. A pixel structure, comprising a pixel circuit, the pixel circuit comprises a light-emitting area and a non-light-emitting area, wherein:
the pixel circuit comprises one or more storage capacitors, and electrodes of at least one of the storage capacitors are arranged in the light-emitting area;
wherein the pixel structure further comprises a power line; and the electrodes of the storage capacitor comprise a first electrode and a second electrode, and the first electrode and the second electrode are arranged at a same layer, and arranged integrally;

wherein the pixel circuit comprises at least one thin film transistor arranged in the non-light-emitting area, and a light-shielding electrically-conductive layer corresponding to the thin film transistor, and the light-shielding layer is configured to shield light rays incident on the thin film transistor; and the second electrode is arranged at a same layer as the light-shielding layer, and processes for fabricating the second electrode and the light-shielding layer are same, and materials of the second electrode and the light-shielding layer are same.

2. The pixel structure according to claim 1, further comprises a third electrode arranged opposite to the first electrode and the second electrode, and the first electrode, the second electrode, and the third electrode form a capacitor.

3. The pixel structure according to claim 2, wherein an active layer of the thin film transistor is an ion-doped semiconductor material, and the third electrode is an electrically-conductive layer which is formed by materials same as that of the active layer in a same process as the active layer.

4. The pixel structure according to claim 3, wherein:
the thin film transistor comprises a switch thin film transistor;
the pixel structure comprises a plurality of insulation layers, and a second lead;
the second electrode and the third electrode are connected with one terminal of the second lead respectively through a third through-hole and a fourth through-hole arranged on the insulation layers; and a drain of the switch thin film transistor is connected with the other terminal of the second lead through a fifth through-hole arranged on the insulation layers; and
the second lead is arranged on a side of the first electrode away from the second electrode, and electrically insulated from the first electrode.

5. A display device, comprising the pixel structure according to claim 1.

6. A method for fabricating the pixel structure according to claim 1, the method comprising fabricating the pixel circuit, wherein at least one storage capacitor in the pixel circuit is fabricated in the light-emitting area;
wherein each storage capacitor of the pixel structure comprises a first electrode and a second electrode arranged opposite to each other, and the pixel structure further comprises a power line connected with the first electrode; and
the fabricating method further comprises forming the first electrode, and the power line in the pixel structure in a same process by: forming an electrically-conductive layer, and patterning the electrically-conductive layer, so that the electrically-conductive layer in a preset area of the power line is reserved as the power line, the electrically-conductive layer in the light-emitting area of the pixel structure is reserved as the first electrode, and the electrically-conductive layer between the first electrode and the power line is reserved so that the first electrode is connected with the power line.

7. The fabricating method according to claim 6, wherein the pixel structure comprises a thin film transistor arranged in a non-display area, and a light-shielding layer arranged below the thin film transistor; and
the fabricating method further comprises forming the light-shielding layer and the second electrode in a same process by: forming a light-shielding electrically-conductive layer, and patterning the electrically-conductive layer, so that the electrically-conductive layer in a preset area of the light-shielding layer is reserved as the light-shielding layer, and the electrically-conductive layer in the light-emitting area is reserved as the second electrode.

8. The fabricating method according to claim 6, wherein the pixel structure comprises a thin film transistor arranged in a non-display area; and
the fabricating method further comprises forming a gate of the thin film transistor, and the second electrode in a same process by: forming an electrically-conductive layer, and patterning the electrically-conductive layer, so that the electrically-conductive layer in a preset area of the gate is reserved as the gate, and the electrically-conductive layer in the light-emitting area is reserved as the second electrode.

9. The fabricating method according to claim 6, wherein the pixel structure further comprises a third electrode arranged opposite to the first electrode and the second electrode; and
the fabricating method further comprises forming an active layer of the thin film transistor and the third electrode in a same process by: forming a doped semiconductor layer, and patterning the semiconductor layer, so that the semiconductor layer in a preset area of the active layer is reserved as the active layer, and the semiconductor layer in the light-emitting area is reserved as the third electrode.

10. The fabricating method according to claim 8, further comprises forming a first lead by: forming a doped semiconductor layer, and patterning the doped semiconductor layer, so that the semiconductor layer between the light-emitting area and the power line is reserved as the first lead, and the semiconductor layer in a preset area of an active layer is reserved as the active layer.

11. A pixel structure, comprising a pixel circuit, the pixel circuit comprises a light-emitting area and a non-light-emitting area, wherein:
the pixel circuit comprises one or more storage capacitors, and electrodes of at least one of the storage capacitors are arranged in the light-emitting area;
wherein the pixel structure further comprises a power line; and the electrodes of the storage capacitor comprise a first electrode and a second electrode, and the first electrode and the second electrode are arranged at a same layer, and arranged integrally;
wherein the pixel circuit comprises at least one thin film transistor arranged in the non-light-emitting area, and the second electrode is arranged at a same layer as a gate of the thin film transistor, and processes for fabricating the thin film transistor and the second electrode are same, and materials of the thin film transistor and the second electrode are same.

12. The pixel structure according to claim 11, wherein:
the thin film transistor comprises a switch thin film transistor;
the pixel structure comprises a plurality of insulation layers, and a first lead;
the second electrode is connected with one terminal of the first lead through a first through-hole arranged on the insulation layers; and a drain of the switch thin film transistor is connected with other terminal of the first lead through a second through-hole arranged on the insulation layers; and
the first lead is arranged at a same layer as an active layer of the thin film transistor, and processes for fabricating the first lead and the active layer are same, and materials of the first lead and the active layer are same.

13. A display device, comprising the pixel structure according to claim 11.

14. A method for fabricating the pixel structure according to claim 11, the method comprising fabricating a pixel circuit, wherein at least one storage capacitor in the pixel circuit is fabricated in a light-emitting area;
   wherein each storage capacitor of the pixel structure comprises a first electrode and a second electrode arranged opposite to each other, and the pixel structure further comprises a power line connected with the first electrode; and
   the fabricating method further comprises forming the first electrode, and the power line in the pixel structure in a same process by: forming an electrically-conductive layer, and patterning the electrically-conductive layer, so that the electrically-conductive layer in a preset area of the power line is reserved as the power line, the electrically-conductive layer in the light-emitting area of the pixel structure is reserved as the first electrode, and the electrically-conductive layer between the first electrode and the power line is reserved so that the first electrode is connected with the power line.

15. The fabricating method according to claim 14, wherein the pixel structure comprises a thin film transistor arranged in a non-display area, and a light-shielding layer arranged below the thin film transistor; and
   the fabricating method further comprises forming the light-shielding layer and the second electrode in a same process by: forming a light-shielding electrically-conductive layer, and patterning the electrically-conductive layer, so that the electrically-conductive layer in a preset area of the light-shielding layer is reserved as the light-shielding layer, and the electrically-conductive layer in the light-emitting area is reserved as the second electrode.

16. The fabricating method according to claim 14, wherein the pixel structure comprises a thin film transistor arranged in a non-display area; and
   the fabricating method further comprises forming a gate of the thin film transistor, and the second electrode in a same process by: forming an electrically-conductive layer, and patterning the electrically-conductive layer, so that the electrically-conductive layer in a preset area of the gate is reserved as the gate, and the electrically-conductive layer in the light-emitting area is reserved as the second electrode.

17. The fabricating method according to claim 14, wherein the pixel structure further comprises a third electrode arranged opposite to the first electrode and the second electrode; and
   the fabricating method further comprises forming an active layer of a thin film transistor and the third electrode in a same process by: forming a doped semiconductor layer, and patterning the semiconductor layer, so that the semiconductor layer in a preset area of the active layer is reserved as the active layer, and the semiconductor layer in the light-emitting area is reserved as the third electrode.

18. The fabricating method according to claim 14, further comprises forming a first lead by: forming a doped semiconductor layer, and patterning the doped semiconductor layer, so that the semiconductor layer between the light-emitting area and the power line is reserved as the first lead, and the semiconductor layer in a preset area of an active layer is reserved as the active layer.

* * * * *